Aug. 12, 1958 W. D. CALKINS 2,847,571

PULSE GENERATOR

Filed May 13, 1955

INVENTOR
WALTER D. CALKINS
BY Charles S. Evans
his ATTORNEY 2,847,571
Patented Aug. 12, 1958

2,847,571

PULSE GENERATOR

Walter D. Calkins, San Jose, Calif., assignor to Jennings Radio Manufacturing Corporation, San Jose, Calif., a corporation of California Application May 13, 1955, Serial No. 508,151

5 Claims. (Cl. 250—36)

My invention relates to an improved electrical pulse generator, and in particular to an oscillator for producing variable-width voltage pulses of independent variable spacing.

Apparatus of this type is employed extensively in electronic circuitry for many purposes including the control of pulses, timing of relay tubes, production of steep-sided and flat-topped pulses having low repetition rates, and generally in applications where wide rectangular pulses must be adjusted as desired into narrow rectangular pulses having high repetition rates.

A principal object of my invention is to provide improved structure for generating variable-width voltage pulses of independent variable spacing which is economical in the number and cost of the components used and which may be easily manufactured.

Another object of my invention is to provide an electronic oscillator which is capable of generating broad ranges of pulse repetition rates and pulse widths.

Another object of my invention is to provide an electronic oscillator which can be readily adjusted to desired pulse repetition rates and pulse widths, and which will maintain the relationship of pulse width to pulse spacing at a substantially constant value.

Another object of my invention is to provide an electronic oscillator which is capable of generating adjustably variable pulse widths and pulse spacing, each function being substantially independent of the other and with a minimum of detrimental circuit interaction.

Another object of my invention is to substantially improve the rectangular waveform of the output pulses generated by apparatus of the foregoing type.

Other objects will be brought out in the following description of the invention. I do not limit myself to the showing made by said description and the drawings, since I may use variant forms of the invention within the scope of the appended claims.

In the usual prior art arrangements for generating pulses of variable rate and width, a stable variable-frequency, blocked oscillator or multivibrator is used to trigger a flip-flop circuit into an initial "on" condition, and a second synchronized blocked oscillator or multivibrator is then used to trigger the flip-flop circuit into an "off" condition. In order to attain complete freedom from all undesired interaction between the variable rate and the variable width functions, relatively complex synchronizing means are connected to the blocked oscillator or multivibrator for triggering the flip-flop circuit into the "off" condition.

A principal feature of the pulse generator of my invention comprises a two-stage, resistance-capacitance-coupled amplifier with one tube normally cut off and the other normally conducting. A novel feedback loop is provided between the anode circuit of the normally conducting stage and the control grid of the stage that is normally cut off, whereby a free-running oscillator generating variable pulse widths and rates is provided.

In a preferred embodiment, the two stage amplifier is a single-shot, cathode-coupled multivibrator; and a gas tube relaxation oscillator translates voltage variations across the plate load resistor for the normally conducting stage into positive trigger pulses which are appropriately applied to the control grid of the stage that is normally cut off, whereby the combination is operative as a free-running oscillator.

Another feature of this invention relates to improved arrangements for coupling the two stages of the multivibrator to one another, and for coupling a trigger source to a multivibrator whereby a substantially improved rectangular output waveform is attained.

Referring to the drawings.

Figure 1:
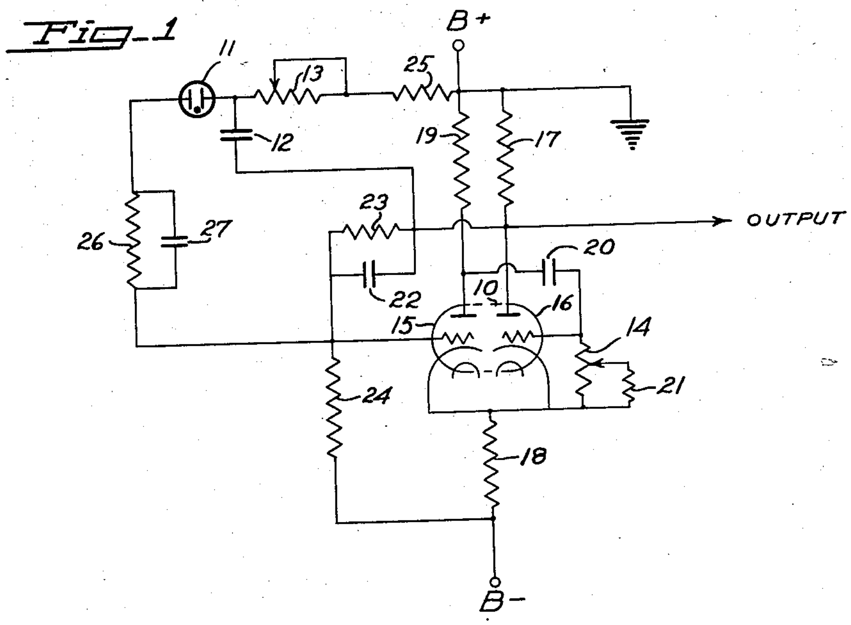
Fig. 1 is a schematic circuit diagram of a preferred embodiment of my pulse generator.
Figure 2:
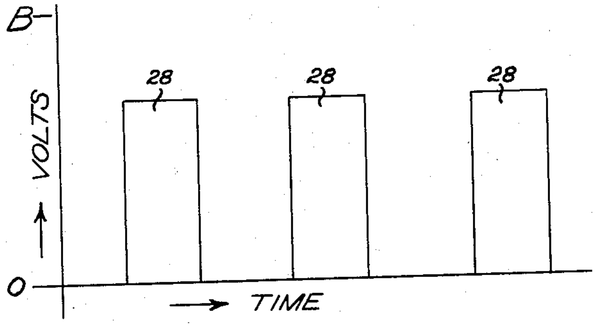
Fig. 2 is a graphical representation of the output waveform produced by the structure of Fig. 1.

Vacuum tube 10 and associated components are connected to form a single-shot, cathode, cathode-coupled multivibrator. This single-shot generator is continuously triggered by a gas-tube, relaxation oscillator comprising gas tube 11, capacitor 12 and associated components. The composite circuitry forms a free-running pulse generator having output pulses appearing between the output terminal and ground which are adjustably variable in width with an independent, adjustably variable pulse spacing. The time duration or width of the output pulses is determined by the particular setting of the variable tap of potentiometer 13, and the pulse spacing is determined by the particular setting of the variable tap of potentiometer 14.

Vacuum tube 10 employed in the single-shot multivibrator comprises two triode sections 15 and 16 contained within a single envelope and may be, for example, a medium mu twin triode such as a 6SN7GT. It will be understood, however, that separate triodes may be employed for each of tube sections 15 and 16.

Broadly speaking, the two tube sections are interconnected to form a two-stage resistance-capacitance-coupled amplifier with tube section 15 being normally cut off and tube section 16 being normally conducting. This current conduction condition of the circuit is established by the arrangement for biasing the tube sections. In particular, the control grid of tube section 16 is connected to its associated cathode through potentiometer 14 thereby providing a zero bias, and accordingly a voltage drop normally appears across plate load resistor 17. The cathodes of both tube sections 15 and 16 are directly connected to one another and the B minus potential is applied thereto through a common cathode resistor 18. The voltage drop across resistor 18 applies a relatively high negative bias to tube section 15 thereby cutting off plate current flow in this section. A negligible voltage drop therefore appears across plate load resistor 19 for tube section 15. The foregoing current conduction conditions prevail until the multivibrator is triggered by a positively directed pulse which is applied between the control grid and cathode of tube section 15 as will be hereinafter set forth in detail.

The upper terminal ends of plate load resistors 17 and 19 for tube sections 16 and 15, respectively, are directly connected to the B plus terminal. Inasmuch as the generator shown in Fig. 1 is designed to produce output pulses having a base potential equal to a substantially zero voltage, the B plus terminal is grounded. This arrangement provides a negatively directed "off" bias between the output terminal and ground. In the event a positively directed "on" bias is desired, the ground connection is removed from the B plus terminal and applied to the B minus terminal.

Capacitor 20 couples the anode of tube section 15 to the control grid of tube section 16. Capacitor 20 and the effective resistance of potentiometer 14 and the partial shunt provided by resistor 21 differentiate the potential variations appearing at the anode of tube section 15, and the differentiated pulses are applied to the control grid-cathode space path of tube section 16 thereby overcoming the normally zero bias and cutting off current flow in tube section 16. The time constant of this differentiating circuit is adjusted by moving the variable tap of potentiometer 14.

The anode of tube section 16 is coupled to the control grid of tube section 15 by capacitor 22 and its shunting resistor 23. This resistor-capacitor combination speeds up the action of tube section 15 going "on" and tube section 16 going "off," inasmuch as capacitor 22 functions to overcome the charging time otherwise required due to the input capacitance of tube section 15. A grid return path for tube section 15 is provided by resistor 24.

The potential variations appearing across plate load resistor 17 are applied to capacitor 12 of the relaxation oscillator by a circuit connection including resistor 25, potentiometer 13, and capacitor 12 back to the lower terminal of resistor 17. The charge potential across capacitor 12 is applied to a neon-type gas tube 11 through resistors 26 and 23. The relaxation oscillator operates in the characteristic manner in that gas tube 11 breaks down whenever the charge potential across capacitor 12 is sufficiently large that the potential applied across gas tube 11 exceeds the ionization potential. Resistor 26 and its shunting capacitor 27 are included in the circuit to speed up the triggering action of the single-shot multivibrator and to limit the discharge current continued through gas tube 11.

The detailed operation of the foregoing circuitry is as follows:

Initially, during the "off" period for tube 10, tube section 16 is at zero bias and a substantial voltage drop appears across plate load resistor 17 for this section. The output terminal therefore assumes a substantial negative potential with respect to ground. The resulting current flow through common cathode resistor 18 applies a relatively high negative bias to tube section 15 thereby cutting off plate flow in this section.

The negative potential of the output terminal is maintained below ground potential until a positively directed pulse is applied to the control grid of tube section 15 by the relaxation oscillator which is rendered operative in response to the voltage drop across resistor 17. When the breakdown potential for gas tube 11 is attained, capacitor 12 discharges through gas tube 11, resistor 26 and resistor 23, together with the capacitors individually shunting each of said resistors.

With this occurrence, tube section 15 generates a negatively directed amplified pulse across its plate load resistor 19. This pulse is coupled to the control grid of tube section 16 through capacitor 20 thereby lowering the bias on the control grid to tube section 16 from zero to a relatively high negative value. This operation reduces the current through the common cathode resistor 18. The bias applied to the control grid of tube section 15 is therefore correspondingly lowered. This alternate condition of the two tube sections is maintained until the charge applied to the control grid of tube section 16 is slowly dissipated by discharge through potentiometer 14 and the partial shunting resistor 21. At the time that the bias voltages on the control grids of both tube sections 15 and 16 become approximately equal, a sudden reversal in the electrical balance in the plate current of the two tubes is brought about whereby tube section 15 is again cut off and tube section 16 is rendered conducting.

A graphical representation of the output waveform of the foregoing circuit is shown in Fig. 1. Time is plotted on the horizontal axis, and negative volts on the vertical axis. The maximum negative amplitude of the train of pulses 28 is substantially below the B minus potential because of the voltage drop across resistor 18 and the anode-cathode space path of tube section 16 during current conduction in this section. The width of each of the negatively directed pulses 28 is determined by the particular setting of potentiometer 13, and the spacing between each pair of pulses is determined by the particular setting of potentiometer 14.

It is to be understood that the above-described arrangement is illustrative of the application of the principles of this invention. Numerous other arrangements may be devised by those skilled in the art without departing from the scope of the invention.

I claim:

1. A pulse generator comprising a single-shot, cathode-coupled multivibrator including two tubes having at least anode, cathode and control grid electrodes, a pair of plate load impedance elements, a source of positive potential individually applied to each of said anodes through a different one of said plate load impedance elements, a cathode impedance element, a source of negative potential commonly applied to both of said cathodes through said cathode impedance element, a capacitor connecting the anode of one tube to the control grid of the second tube, a variable impedance element connecting the control grid of the second tube to its cathode, an impedance element connecting the control grid of the first tube to the negative terminal of said cathode impedance element, a gas tube relaxation oscillator including a serially connected variable impedance element and charge capacitor shunting the plate load impedance element for the second tube, and a serially connected gas tube and impedance element shunting said charge capacitor and connected to the control grid of said first tube to apply a positive trigger voltage thereto in response to substantial current conduction in the second tube thereby momentarily overcoming the cut off bias applied to the first tube by the cathode impedance element and producing a free-running generator of pulses.

2. A free-running pulse generator comprising a single pulse generator including two tubes having at least anode, cathode and control grid electrodes, a pair of plate load impedance elements, a source of positive potential individually applied to each of said anodes through a different one of said plate load impedance elements, a cathode impedance element, a source of negative potential commonly applied to both of said cathodes through said cathode impedance element, a capacitor connecting the anode of one tube to the control grid of the second tube, a variable impedance element connecting the control grid of the second tube to its cathode, an impedance element connecting the control grid of the first tube to the negative terminal of said cathode impedance element, a gas tube relaxation oscillator including a serially connected variable impedance element and charge capacitor shunting the plate load impedance element for the second tube, and a serially connected gas tube and impedance element shunting said charge capacitor and connected to the control grid of said first tube to apply a positive trigger voltage thereto.

3. A free-running pulse generator comprising a single pulse generator including two tubes having at least anode, cathode and control grid electrodes, a pair of plate load impedance elements, a source of positive potential individually applied to each of said anodes through a different one of said plate load impedance elements, a cathode impedance element, a source of negative potential commonly applied to both of said cathodes through said cathode impedance element, a capacitor connecting the anode of one tube to the control grid of the second tube, a variable impedance element connecting the control grid of the second tube to its cathode, an impedance element connecting the control grid of the first tube to the negative terminal of said cathode impedance element, and a gas tube relaxation oscillator interconnecting the control grid of the first tube and the anode of the second tube whereby the single pulse generator is continuously triggered after each generated pulse to produce a free-running generator of pulses.

4. The combination of claim 1 including a capacitor shunting the impedance element serially connected to said gas tube, thereby minimizing the time required for said relaxation oscillator to trigger said multivibrator.

5. The combination of claim 1 including a shunt connected impedance element and capacitor directly connecting the control grid of the first tube to the anode of the second tube thereby facilitating the reversal of current conduction in the two tubes.

References Cited in the file of this patent

UNITED STATES PATENTS

| | | |
|---|---|---|
| 2,154,492 | Clough | Apr. 18, 1939 |
| 2,452,549 | Cleeton | Nov. 2, 1948 |
| 2,516,867 | Harris | Aug. 1, 1950 |